(12) United States Patent
Mandai et al.

(10) Patent No.: US 10,928,492 B2
(45) Date of Patent: Feb. 23, 2021

(54) MANAGEMENT OF HISTOGRAM MEMORY FOR A SINGLE-PHOTON AVALANCHE DIODE DETECTOR

(71) Applicant: Apple Inc., Cupertino, CA (US)

(72) Inventors: Shingo Mandai, Mountain View, CA (US); Cristiano L. Niclass, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/877,121

(22) Filed: May 18, 2020

(65) Prior Publication Data

US 2020/0278429 A1     Sep. 3, 2020

Related U.S. Application Data

(62) Division of application No. 15/879,350, filed on Jan. 24, 2018, now Pat. No. 10,656,251.

(Continued)

(51) Int. Cl.

| | |
|---|---|
| *G01S 7/4863* | (2020.01) |
| *G01J 1/44* | (2006.01) |
| *G01S 7/4865* | (2020.01) |
| *G01S 17/10* | (2020.01) |
| *H01L 27/146* | (2006.01) |
| *H01L 31/107* | (2006.01) |

(52) U.S. Cl.
CPC .............. *G01S 7/4863* (2013.01); *G01J 1/44* (2013.01); *G01S 7/4865* (2013.01); *G01S 17/10* (2013.01); *G01J 2001/442* (2013.01); *G01J 2001/4466* (2013.01); *H01L 27/14643* (2013.01); *H01L 31/107* (2013.01)

(58) Field of Classification Search
CPC ...... G01S 7/4863; G01S 7/4865; G01S 17/10; G01S 7/487; G01J 1/44; G01J 2001/442; G01J 2001/4466; G01J 1/0228; G01J 1/0233; H01L 27/14643; H01L 31/107
See application file for complete search history.

(56) References Cited

U.S. PATENT DOCUMENTS

| | | |
|---|---|---|
| 7,453,131 B2 | 11/2008 | Marshall et al. |
| 7,589,316 B2 | 9/2009 | Dunki-Jacobs |

(Continued)

FOREIGN PATENT DOCUMENTS

| | | |
|---|---|---|
| CN | 103299437 | 9/2013 |
| CN | 103779437 | 5/2014 |

(Continued)

OTHER PUBLICATIONS

Charbon, et al., SPAD-Based Sensors, *TOF Range-Imaging Cameras*, F. Remondino and D. Stoppa (eds.), 2013, Springer-Verlag Berlin Heidelberg, pp. 11-38.

(Continued)

*Primary Examiner* — Seung C Sohn
(74) *Attorney, Agent, or Firm* — Brownstein Hyatt Farber Schreck, LLP

(57) ABSTRACT

A single-photon avalanche diode (SPAD) detector includes a pixel array comprising multiple pixels and a memory operably connected to the pixel array. Each pixel includes a SPAD. Various techniques for accumulating signals received from the same SPAD over multiple scans and storing the accumulated signals in the memory are disclosed.

20 Claims, 10 Drawing Sheets

Related U.S. Application Data

(60) Provisional application No. 62/450,514, filed on Jan. 25, 2017.

(56) References Cited

U.S. PATENT DOCUMENTS

| | | | |
|---|---|---|---|
| 7,667,400 | B1 | 2/2010 | Goushcha |
| 7,696,483 | B2 | 4/2010 | Tkaczyk |
| 7,714,292 | B2 | 5/2010 | Agarwal et al. |
| 7,838,956 | B2 | 11/2010 | McCarten et al. |
| 8,355,117 | B2 | 1/2013 | Niclass |
| 8,637,875 | B2 | 1/2014 | Finkelstein et al. |
| 8,653,434 | B2 | 2/2014 | Johnson et al. |
| 8,724,096 | B2 | 5/2014 | Gosch et al. |
| 8,874,377 | B1 | 10/2014 | Sickenberger |
| 9,006,641 | B2 | 4/2015 | Drader |
| 9,058,081 | B2 | 6/2015 | Baxter |
| 9,151,829 | B2 | 10/2015 | Campbell |
| 9,160,949 | B2 | 10/2015 | Zhang et al. |
| 9,164,144 | B2 | 10/2015 | Dolinsky |
| 9,176,241 | B2 | 11/2015 | Frach |
| 9,178,100 | B2 | 11/2015 | Webster et al. |
| 9,209,320 | B1 | 12/2015 | Webster |
| 9,312,401 | B2 | 4/2016 | Webster |
| 9,313,434 | B2 | 4/2016 | Dutton et al. |
| 9,331,116 | B2 | 5/2016 | Webster |
| 9,354,332 | B2 | 5/2016 | Zwaans |
| 9,417,326 | B2 | 8/2016 | Niclass et al. |
| 9,448,110 | B2 | 9/2016 | Wong |
| 9,478,030 | B1 | 10/2016 | Lecky |
| 9,516,244 | B2 | 12/2016 | Borowski |
| 9,560,339 | B2 | 1/2017 | Borowski |
| 9,639,063 | B2 | 5/2017 | Dutton et al. |
| 9,661,308 | B1 | 5/2017 | Wang et al. |
| 9,685,576 | B2 | 6/2017 | Webster |
| 9,831,283 | B2 | 11/2017 | Shepard et al. |
| 9,915,733 | B2 | 3/2018 | Fried et al. |
| 9,935,231 | B2 | 4/2018 | Roehrer |
| 9,939,316 | B2 | 4/2018 | Scott |
| 9,952,323 | B2 | 4/2018 | Deane |
| 9,985,163 | B2 | 5/2018 | Moore |
| 10,026,772 | B2 | 7/2018 | Shinohara |
| 10,067,224 | B2* | 9/2018 | Moore ................ G01S 17/14 |
| 10,145,678 | B2 | 12/2018 | Wang et al. |
| 10,153,310 | B2 | 12/2018 | Zhang et al. |
| 10,217,889 | B2 | 2/2019 | Dhulla et al. |
| 10,267,901 | B2 | 4/2019 | Drader |
| 10,416,293 | B2* | 9/2019 | Buckley ................ G01S 7/4861 |
| 10,438,987 | B2 | 10/2019 | Mandai et al. |
| 10,451,736 | B2 | 10/2019 | Stutz |
| 10,495,736 | B2 | 12/2019 | Zhuang et al. |
| 10,613,225 | B2 | 4/2020 | Kubota et al. |
| 10,620,300 | B2 | 4/2020 | Sharma et al. |
| 2010/0159632 | A1 | 6/2010 | Rhodes et al. |
| 2012/0162632 | A1 | 6/2012 | Dutton |
| 2018/0090526 | A1 | 3/2018 | Mandai et al. |
| 2018/0209846 | A1 | 7/2018 | Mandai et al. |
| 2019/0018119 | A1 | 1/2019 | Laifenfeld et al. |
| 2019/0198701 | A1 | 6/2019 | Moussy |
| 2020/0286946 | A1 | 9/2020 | Mandai et al. |

FOREIGN PATENT DOCUMENTS

| | | |
|---|---|---|
| CN | 104103655 | 10/2014 |
| CN | 104779259 | 7/2015 |
| CN | 104810377 | 7/2015 |
| CN | 105185796 | 12/2015 |
| DE | 102010060527 | 4/2012 |
| EP | 2787531 | 10/2014 |
| JP | 2004319576 | 11/2004 |
| JP | 2012038981 | 2/2012 |
| JP | 2012169530 | 9/2012 |
| JP | 2014081254 | 5/2014 |
| JP | 2014225647 | 12/2014 |
| JP | 2015041746 | 3/2015 |
| JP | 2016145776 | 8/2016 |
| WO | WO 12/011095 | 1/2012 |
| WO | WO 12/032353 | 3/2012 |
| WO | WO 17/112416 | 6/2017 |

OTHER PUBLICATIONS

Cox, "Getting histograms with varying bin widths," http://www.stata.com/support/faqs/graphics/histograms-with-varying-bin-widths/, Nov. 13, 2017, 5 pages.

Gallivanoni, et al., "Progress n Quenching Circuits for Single Photon Avalanche Diodes," IEEE Transactions on Nuclear Science, vol. 57, No. 6, Dec. 2010, pp. 3815-3826.

Jahromi et al., "A Single Chip Laser Radar Receiver with a 9x9 SPAD Detector Array and a 10-channel TDC," 2013 Proceedings of the ESSCIRC, IEEE, Sep. 14, 2015, pp. 364-367.

Leslar, et al., "Comprehensive Utilization of Temporal and Spatial Domain Outlier Detection Methods for Mobile Terrestrial LiDAR Data," *Remote Sensing*, 2011, vol. 3, pp. 1724-1742.

Mota, et al., "A flexible multi-channel high-resolution Time-to-Digital Converter ASIC," *Nuclear Science Symposium Conference Record IEEE*, 2000, Engineering School of Geneva, Microelectronics Lab, Geneva, Switzerland, 8 pages.

Niclass, et al., "Design and Characterization of a CMOS 3-D Image Sensor Based on Single Photon Avalanche Diodes," *IEEE Journal of Solid-State Circuits*, vol. 40, No. 9, Sep. 2005, pp. 1847-1854.

Shin, et al., "Photon-Efficient Computational 3D and Reflectivity Imaging with Single-Photon Detectors," IEEE International Conference on Image Processing, Paris, France, Oct. 2014, 11 pages.

Tisa, et al., "Variable-Load Quenching Circuit for single-photon avalanche diodes," Optics Express, vol. 16, No. 3, Feb. 4, 2008, pp. 2232-2244.

Ullrich, et al., "Linear Lidar versus Geiger-mode LIDAR: Impact on data properties and data quality," *Laser Radar Technology and Applications XXI*, edited by Monte D. Turner, Gary W. Kamerman, Proc. of SPIE, vol. 9832, 983204, 2016, 17 pages.

* cited by examiner

MANAGEMENT OF HISTOGRAM MEMORY FOR A SINGLE-PHOTON AVALANCHE DIODE DETECTOR

CROSS-REFERENCE TO RELATED APPLICATIONS

This application is a division of U.S. patent application Ser. No. 15/879,350, filed Jan. 24, 2018, and entitled "Signal Acquisition in a SPAD Detector," which claims the benefit under 35 U.S.C. § 119(e) of U.S. Provisional Patent Application No. 62/450,514, filed on Jan. 25, 2017, and entitled "Signal Acquisition in an SPAD Detector," the contents of which are incorporated by reference as if fully disclosed herein.

FIELD

The described embodiments relate generally to SPAD detectors, i.e., light detectors using single-photon avalanche diodes (SPADs). More particularly, the present embodiments relate to techniques for improving the signal-to-noise ratio of a SPAD detector while preserving the spatial resolution in the SPAD detector.

BACKGROUND

SPAD detectors are utilized in a variety of applications, such as low-light detection applications, time-of-flight (TOF) applications, and time-correlated single photon counting applications. A SPAD detector typically includes an array of SPAD pixels, with each SPAD pixel including a SPAD and related biasing and/or readout circuitry. Each SPAD includes a photosensitive region that is configured to detect low levels of light (down to a single photon) and to generate a corresponding output signal at the arrival times of the photons. When the light comprises photons of an emitted light pulse that are reflected from an object, the output signal can be used to estimate the arrival times of the photons at the SPAD detector after emission of the light pulse. The arrival times determine a times-of-flight for the photons. Multiple such times-of-flight can be used to estimate a distance to the object.

Under certain conditions, it is desirable to maximize the signal-to-noise ratios (SNR) of the SPADs in a SPAD detector. Such conditions include when a target that has a low reflectivity, an environment where a target is distant from the SPAD detector, or an environment with low lighting (e.g., dusk or night). In some instances, multiple SPADs (e.g., two to three SPADs) may be sensing simultaneously and the signals binned to improve the SNR. However, binning the signals reduces the spatial resolution of the SPAD detector.

SUMMARY

The described embodiments relate to a single-photon avalanche diode (SPAD) detector and various techniques accumulating signals for the same SPAD over multiple scans. In one aspect, a method for operating a SPAD detector includes enabling (i.e., activating for photon detection) an operation of a SPAD in a selected first set of pixels such that the SPAD detects photons, receiving signals from the SPAD over a first time period, and constructing a histogram for the SPAD in a histogram memory based on the signals received over the first time period. The first set of pixels are simultaneously enabled for sensing received photons. The method further includes receiving signals from the SPAD over a second time period and updating the histogram in the histogram memory based on the signals received over the second time period. During the second time period, the SPAD is included in a selected second set of pixels, which may be different from the first set of pixels. The histogram may then be read out of the histogram memory.

In another aspect, a SPAD detector includes a pixel array comprising multiple pixels, a time-to-digital converter (TDC) array circuit operably connected to the pixel array, and a memory operably connected to the TDC array circuit. The memory is configured to accumulate TDC output values produced by the TDC array circuit, where the TDC array circuit is associated with a SPAD in one pixel and the TDC output values are produced over multiple line scan operations on the pixel. Counts of the TDC output values are accumulated in a histogram memory in the memory. In some embodiments, the pixel can be included in different sets of selected pixels in the pixel array during the multiple line scan operations.

In yet another aspect, a method for operating a SPAD detector includes enabling the SPADs of N pixels, the N pixels comprising a subset of the pixels in a pixel array, and simultaneously receiving signals from the enabled SPADs in the N pixels. A respective histogram memory is selected for each enabled SPAD from a group of N+1 histogram memories and a histogram is constructed for each enabled SPAD in a respective one of the selected histogram memories. Counts of the output signals received from each enabled SPAD over multiple scans of the N pixels are accumulated in the respective selected histogram memories.

In another aspect, a method for operating SPAD detector includes simultaneously receiving signals from the SPADs of N pixels, the N pixels comprising a subset of the pixels in a pixel array, and constructing a corresponding histogram for each SPAD in a respective one of M histogram memories, where M is greater than N. The signals received from each SPAD over multiple scans of the N pixels accumulate in the respective ones of the M histogram memories.

BRIEF DESCRIPTION OF THE DRAWINGS

The disclosure will be readily understood by the following detailed description in conjunction with the accompanying drawings, wherein like reference numerals designate like structural elements, and in which.

Figure 1:
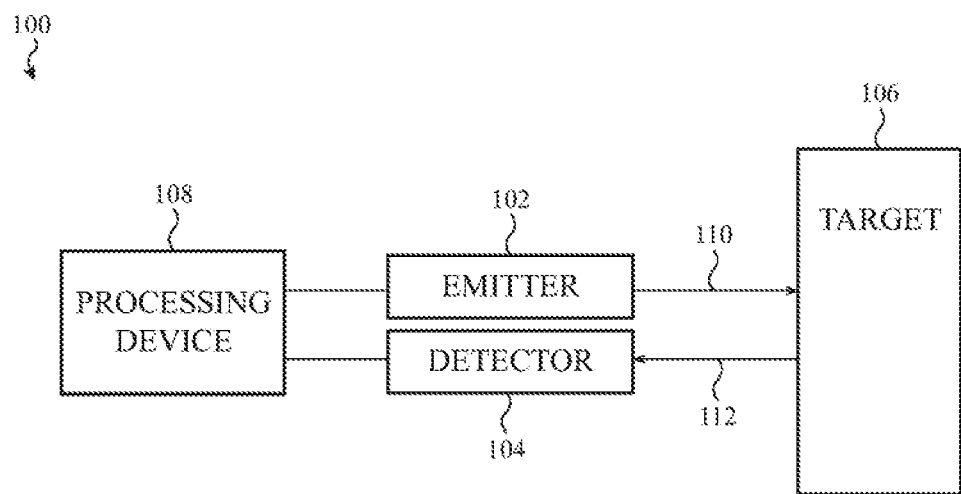
FIG. 1 shows one example of a system that includes one or more SPAD detectors.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to a SPAD detector that uses single-photon avalanche diodes (SPADs). The SPAD detector includes an array of SPAD pixels. Each SPAD pixel (hereinafter just "pixel") includes a SPAD. Each pixel may also include associated biasing and/or control circuit elements, such as one or more of a quenching transistor operably connected to the SPAD, and a gating transistor operably connected to the SPAD. Further circuit elements are described below for various embodiments.

A SPAD detector can be used as part of an imaging or ranging system for determining distances to objects in a field of view (FOV). In many such distance determination operations, a sequence of light pulses are emitted from a light source into the FOV. The light source may be, for example, a laser. The light source may either be a component of the SPAD detector, or operatively linked with the SPAD detector. The emitted light pulses typically have a brief duration after which there is a longer time period in which the light source is off, and the SPAD detector is used to detect reflections of the emitted light pulses from objects in the FOV. The time period between initiation of the emitted light pulses is termed the pulse repetition interval (PRI). By determining the time-of-flight (TOF) between emission of a light pulse and detection of reflected photons, the distance to the object can be determined.

There are a various issues for implementing this process of distance determination. It may be that any particular pixel in the array will only receive a few reflected photons of the emitted pulse. Further, a particular SPAD in a pixel may receive a photon from ambient light and produce an output signal at a time unrelated to the distance to the object.

To account for these and other issues, the TOFs of multiple received photons over multiple PRIs are obtained for a pixel. A detected peak in a distribution of TOF values can then be taken as the actual TOF of photons reflected from the object. Such a statistical measurement for the TOF can be implemented by a histogram of TOF values recorded over multiple PRIs for a pixel. Each bin of such a histogram represents a particular subinterval of time within the PRIs, and each bin can store a count of photons received at the SPAD during that subinterval of time over all the PRIs.

In such systems, the emitted light pulses are swept in a pattern over a field of view (FOV). It is often the case that the reflected pulses then may sweep in a related pattern across the SPAD detector's array of pixels. For example, some ranging systems use a line-scan system in which a sequence of laser pulses is swept horizontally (or vertically) across the FOV at a first level, and then the horizontal sweep is repeated at a lower horizontal level. As a result, reflected pulses of the emitted light pulses from objects in the FOV may be expected to impinge on the pixel array as localized spots that tend to sweep mostly horizontally across the array of pixels. At a certain pixel of the array, during the sweep of the reflected pulses across the array of pixels, the reflected pulses become more centered or focused during the sweep.

Various techniques exist for accumulating signals for the same SPAD over multiple scans. One technique, binning of pixels, involves grouping multiple individual pixels to operate as a single enlarged pixel. For example, four pixels arranged as a square may have all their output signals treated as originating in a single SPAD, and the respective TOFs recorded in a single histogram. This technique may, however, result in a loss of spatial resolution of distance to an object.

Another technique may be used to preserve the spatial resolution of the SPAD detector with respect to binning, and can improve the signal-to-noise ratio (SNR). A histogram is produced for each SPAD. The signals received from the SPAD during the multiple scans can accumulate in the same histogram. In some embodiments, the allocation of the histogram memories reduces or minimizes the amount of die area that is consumed by the SPAD detector and/or reduces the power consumption of the SPAD detector.

These and other embodiments are discussed below with reference to FIGS. 1-10. However, those skilled in the art will readily appreciate that the detailed description given herein with respect to these Figures is for explanatory purposes only and should not be construed as limiting.

FIG. 1 illustrates one example of a system 100 that includes one or more SPAD detectors, each SPAD detector including an array of pixels. The system 100 includes an emitter 102, and a SPAD detector 104, positioned in relationship to an object or target 106. The emitter 102 and the SPAD detector may be a single unit. In the system shown if FIG. 1, the emitter 102 and the SPAD detector 104 each represent one or more emitters and SPAD detectors, respectively. The emitter 102 can be positioned to emit light towards the target 106 and the SPAD detector 104 may be situated to detect light reflected from the scene and/or the target 106.

A processing device 108 is operably connected to the emitter 102 and to the SPAD detector 104. The processing device 108 causes the emitter 102 to emit light towards the target 106 (emitted light represented by arrow 110). The light reflected from the target 106 and/or the scene may be detected by the SPAD detector 104 (reflected light represented by arrow 112). The processing device 108 receives the output signals from the SPAD detector 104 or receives conditioned output signals from intervening signal processing components (not shown). The processing device 108 processes the output signals to determine one or more characteristics associated with the reflected light, the target 106, and/or the scene. The particular components and operations discussed for system 100 are exemplary; in other embodiments the operations discussed may be distributed among the components differently.

The system 100 may be used as part of an electronic device, such as a camera in an mobile phone, that scans a field of view (FOV). In scanning systems light is emitted into the FOV and information about objects or targets in the FOV are determined from reflections of the emitted light. Scanning systems may emit light in multiple directions from multiple emitters, or by sweeping a light (such as from a laser) in one or more directions across some or all of the FOV. A scanning system may use multiple sweeping light emitters, which may sweep the FOV in different directions or patterns.

Figure 2:
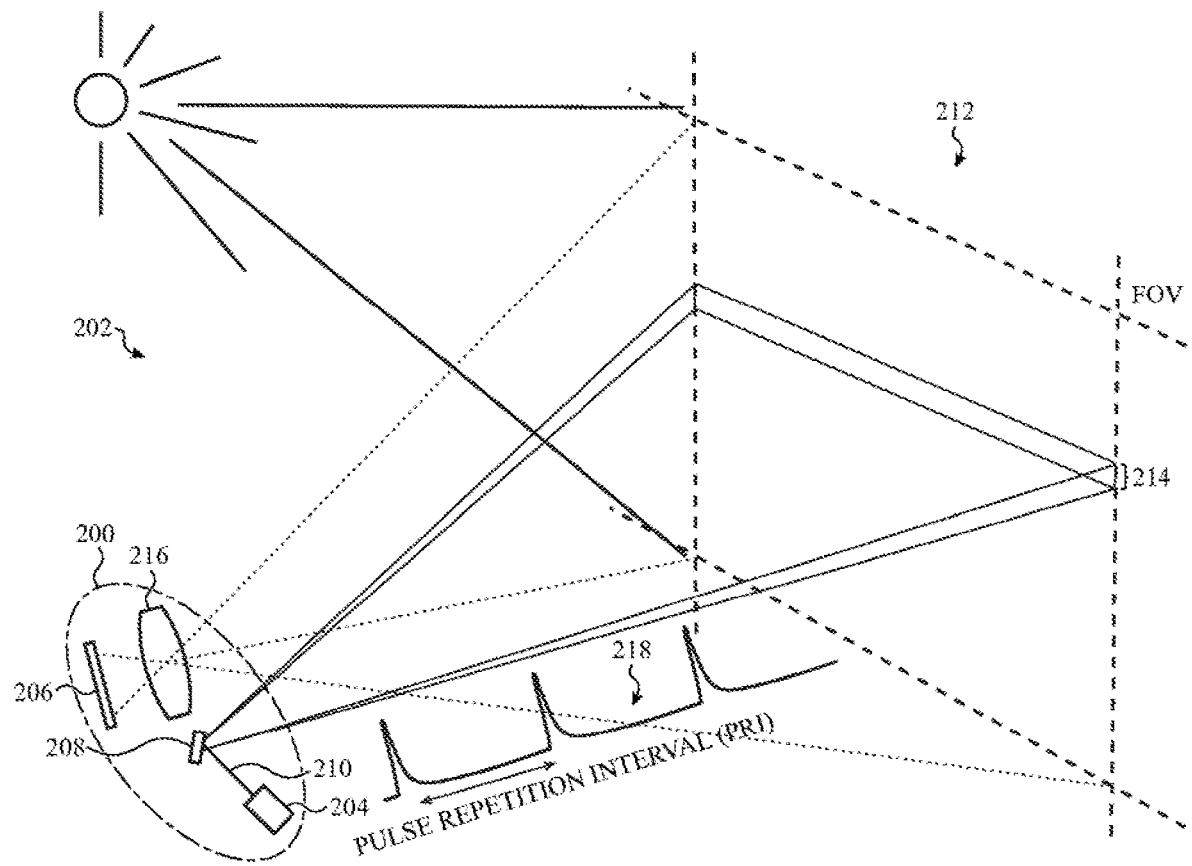
FIG. 2 depicts one example of a line-scan system.

In some embodiments, a SPAD detector is used in a line-scan system. FIG. 2 depicts one example of a line-scan system 200 that uses a SPAD detector positioned in an environment 202. While this description will hereafter discuss the embodiments as used with the line-scan system 200, one of skill in the art will recognize how the embodiments can be used with other scanning systems. The line-scan system 200 includes an emitter 204 and a SPAD detector 206. The emitter 204 is any suitable light emitter, such as a laser. In one embodiment, the emitter 204 may be operated to repeatedly emit light pulses 218 over a period of time. The time period between each light pulse is known as a pulse repetition interval (PRI).

In one embodiment, a beam-steering element 208 (e.g., a mirror) is positioned in the optical path of the emitter 204 to steer the light beam 210 (consisting of light pulses 218) emitted by the emitter 204 toward the field of view (FOV) 212. The beam-steering element 208 is configured to control the propagation angle and path of the light beam 210 so that only a section 214 (e.g., a line or a subset of lines) of the FOV 212 is illuminated at a time. The FOV 212 is scanned section-by-section during a FOV detection period. The FOV detection period is the time period needed to scan a selected part of the FOV 212. Light reflected from a target and/or the scene in the FOV 212 is received by a lens 216 that directs the reflected light onto the SPAD detector 206. The light beam 210 can be steered differently in other embodiments. For example, the emitter 204 can include multiple emitters that each emits light toward a different section of the FOV 212. In additional and/or other embodiments, the emitter may be moved or rotated to emit the light toward different sections of the FOV 212.

The light that is returned to the device (e.g., via reflections off a target and/or the scene in the FOV 212) is received by a lens 216 that directs the light onto the SPAD detector 206. Since the emitted light beam 210 is a series of light pulses 218, the reflected light is comprised of a series of light pulses. As will be described in more detail later, sections of the pixels in the SPAD detector 206 detect the reflected light pulses through a series of line scan operations. Each line scan operation involves the emission of multiple light pulses and detection of reflected photons by selected pixels of the array. Each line scan operation scans or reads out the pixels in a section of the pixel array (e.g., two or three columns at a time). Reading out pixels can involve receiving the output signals produce by the pixels' SPADs, and possibly performing amplification or other conditioning of the output signals. When the line scan operation for one section of pixels is complete, another section of pixels is scanned. In one embodiment, the next section of pixels includes some of the pixels in the previous line scan operation. In another embodiment, the next section of pixels includes different pixels from the pixels in the previous line scan operation. This process repeats until all of the pixels within a chosen subset of pixels of the array have been scanned.

Figure 3:
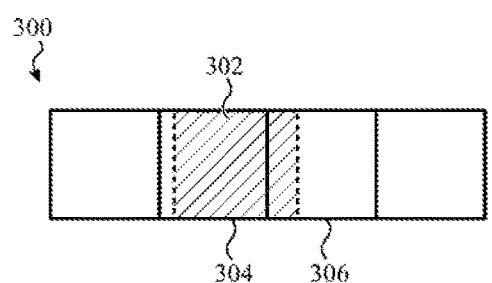
FIG. 3 shows a light beam impinging on multiple pixels in a SPAD detector.

FIG. 3 shows a light beam impinging on multiple pixels in a SPAD detector. For the purpose of illustration, the SPAD detector is shown as having a one-dimensional array of pixels including a line 300 of pixels. This line 300 is depicted as having four pixels, although the line 300 can include any number of pixels. One example of a line 300 of pixels is a row of pixels in a pixel array. As described earlier, an emitter can emit light pulses over a period of time. The light pulses that reflect off objects in the FOV are collectively referred to as a light beam 302. The position of the light beam 302 on the line 300 may not be precise and/or may not be known with certainty. As shown in FIG. 3, the width of the light beam 302 can span multiple pixels (e.g., pixels 304, 306) during a scan. When the light beam 302 spans multiple pixels, a target pixel (e.g., pixel 304) receives photons from a subset of the light beam 302 (i.e., only the portion of the light beam 302 that spans the target pixel), and thus the signals collected from the target pixel (when viewed in isolation) may not fully represent the light beam 302, which in turn may impact the accuracy of time-of-flight measurements taken from a given pixel. As described earlier, multiple pixels (e.g., two to three pixels) may be read out simultaneously and the signals binned to avoid this issue. However, binning signals may reduce the spatial resolution of the SPAD detector.

Embodiments described herein read the same SPAD multiple times and accumulate the signals in a histogram. To reduce power consumption and limit the amount of required memory, the operations of only a subset of the SPADs in the pixel array are enabled based on the location of the light beam on the pixel array. The operations of the remaining SPADs are disabled. In this manner, only the signals read out of the enabled SPADs are accumulated over the multiple scans.

Figure 4:
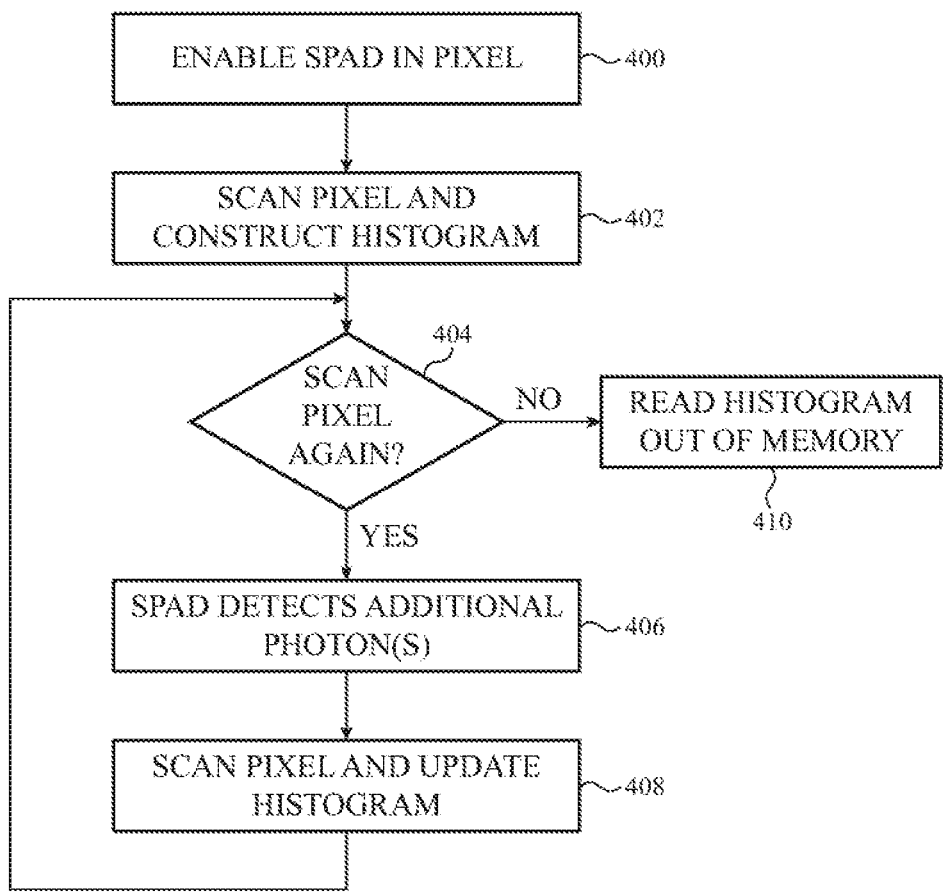
FIG. 4 shows a flowchart of a method of accumulating signals for a single SPAD over multiple scans.

FIG. 4 shows a flowchart of a method of accumulating signals for a single SPAD over multiple scans. Although described with reference to one SPAD, the process can be used with multiple SPADs simultaneously or sequentially. Initially, as shown in block 400, the operations of the SPAD in a pixel are enabled to permit the SPAD to detect photons. An example pixel that includes a SPAD that is configured to be enabled and disabled is described in more detail in conjunction with FIG. 7.

Once enabled, the pixel can receive reflected photons from multiple reflected pulses over multiple PRIs. As shown further in FIG. 5, reflected pulses are steered so as to move across the pixel array during a first scan comprising multiple PRIs. Over the multiple PRIs within the first scan, the output signals of the SPAD are read out and a first histogram of respective TOF values is constructed in a memory (block 402). A determination is then made at block 404 as to whether the pixel is to receive further reflected photons during a subsequent scan, also including multiple PRIs. If another scan operation is to be performed, the process passes to block 406 where the SPAD detects additional photons over the multiple PRIs of the subsequent scan. The pixel signals are then read out again and the histogram updated with the signals obtained during the subsequent scan (block 408). In this manner, the signals produced by the SPAD accumulate in the same histogram over multiple scans. The method then returns to block 404.

When the pixel will not be further scanned at block 404, the method continues at block 410 where the histogram is read out of memory. In some embodiments, the histogram is read out outside of the pixel array die and processed. The histogram represents the counts of the TOFs obtained over the multiple scans of the one SPAD. In this way the histogram measures a distribution of the TOFs that would match the distribution of all the TOFs of all photons in a single reflected pulse. In this manner, the image resolution may be made to match the number of SPADs (or pixels) in the pixel array.

In an alternative embodiment, an additional histogram may be constructed in the memory each time the operation in block 408 is performed. When the pixel will not be scanned again at block 404, the multiple histograms are combined to produce one histogram for the SPAD in the pixel.

Figure 5:
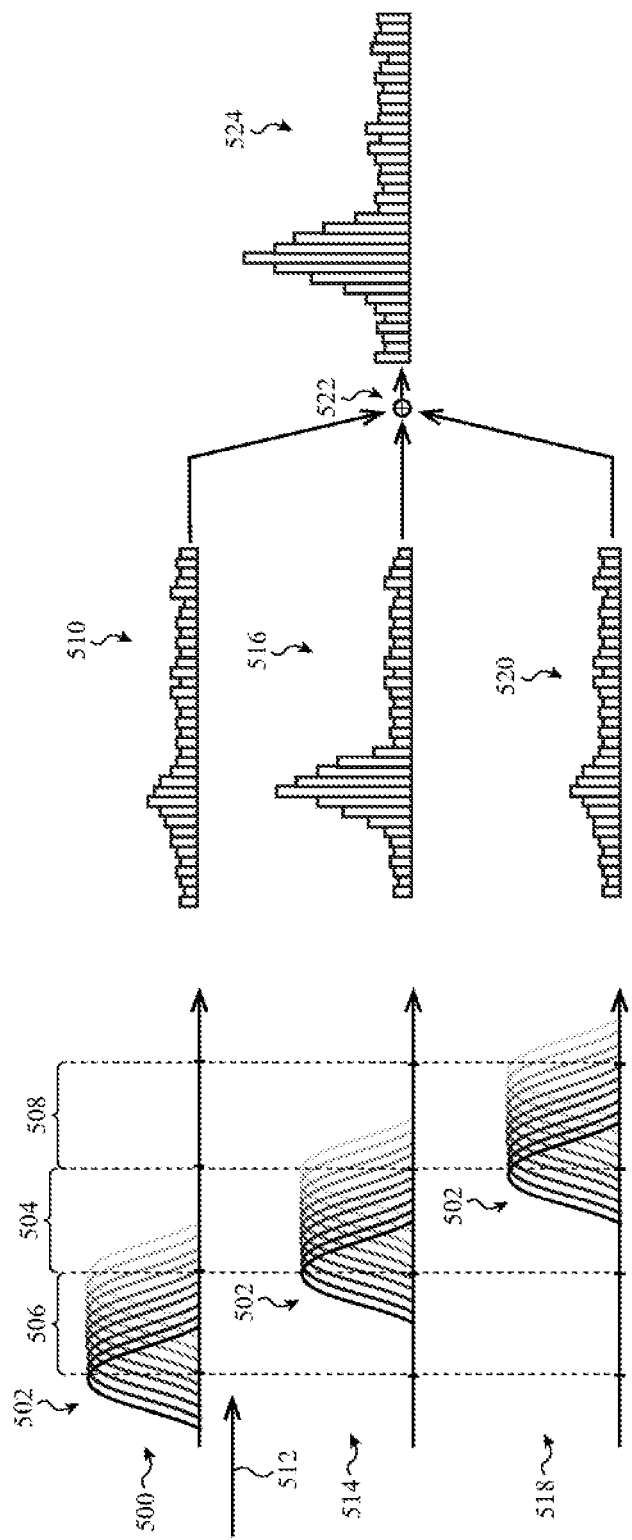
FIG. 5 illustrates the method shown in FIG. 4.

FIG. 5 illustrates the scans that occur in the method shown in FIG. 4. As shown in plot 500, a light beam 502 moves along a line of pixels (e.g., a row of pixels) during a scan operation. In the illustrated embodiment, the light beam 502 moves one pixel in the scans shown in plots 500, 514, 518. For purposes of this example, only the pixel 504 is described as being read out multiple times (e.g., three times). In practice, the neighboring pixels 506, 508 are also read out multiple times while the light beam 502 strikes the pixels 506, 508. Although three readouts are described, other embodiments are not limited to this number of readouts. Two or more readouts can be performed in other embodiments.

In plot 500, the light beam 502 extends across pixel 506 and pixel 504. The pixel 504 is read out and a first histogram 510 is constructed in a memory based on the signals produced by the SPAD in the pixel 504 when the light beam 502 is positioned as shown in plot 500. Each signal represents a detected photon, and the histogram 510 represents the photon count obtained during the readout operation. Each bin in the histogram 510 represents a span of time, and each bin value represents the photon count during that span of time.

As the light beam 502 moves along the line of pixels in the direction indicated by arrow 512, the light beam 502 spans three pixels 504, 506, 508 (plot 514). The output signals of the SPAD of pixel 504 are read out again over the multiple PRIs as light beam 502 moves, and a second histogram 516 is constructed in the memory based on the TOFs of the output signals produced by the SPAD in the pixel 504 when the light beam 502 is positioned as shown in plot 514.

As the light beam 502 continues to move along the line of pixels, the light beam 502 extends across pixels 504, 508 (plot 518). The pixel 504 is read out a third time and a third histogram 520 is constructed in the memory based on the signals produced by the SPAD in the pixel 504 when the light beam 502 is positioned as shown in plot 518.

After the third readout of the pixel 504, the histograms 510, 516, 520 are combined 522 to produce a final histogram 524 for the pixel 504. As described earlier in conjunction with FIG. 4, other embodiments can construct one histogram (e.g., histogram 510) and update that histogram after each subsequent readout of the pixel 504. Essentially, a running photon count is maintained in the histogram over the multiple scans of the pixel 504. In these embodiments, the combining step 522 is omitted and the size of the memory circuit needed to store the histograms is significantly reduced.

The spatial resolution of the SPAD detector is preserved relative to binning when the signals produced by the SPAD in the pixel 504 are accumulated over multiple readouts. Additionally, the method uses and represents substantially all of the energy in the light beam 502.

Figure 6:
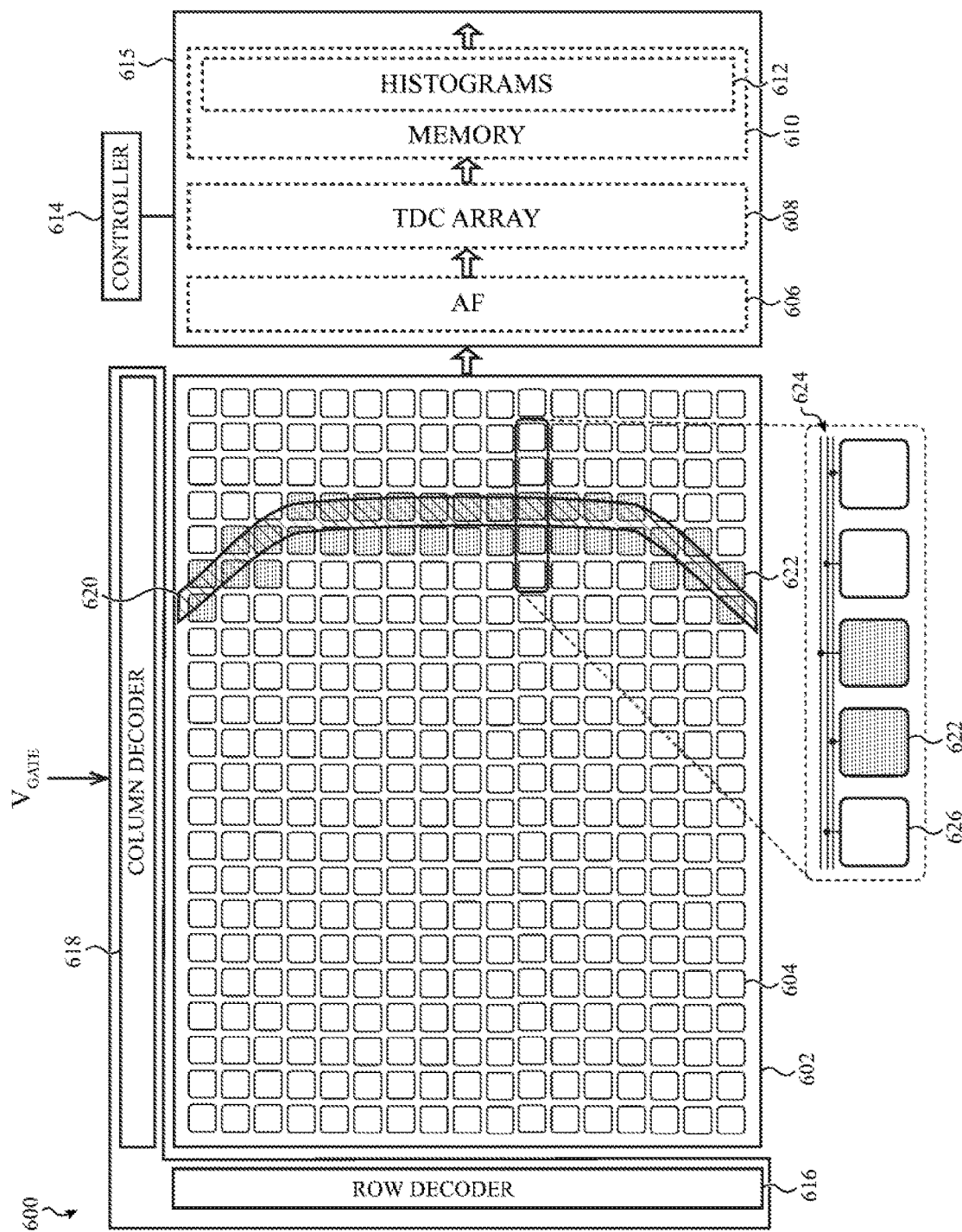
FIG. 6 shows a block diagram of a SPAD detector.

FIG. 6 shows a block diagram of a SPAD detector. The SPAD detector 600 includes a pixel array 602 with multiple pixels 604. The pixel array 602 is operably connected to readout and control circuitry 615. The readout and control circuitry 615 is controlled by the controller 614, which may implemented as part of the processing device 108 or as a separate component operably connected to the processing device 108. In the illustrated embodiment, the pixels 604 in the pixel array 602 are arranged in a row and column arrangement. However, other embodiments are not limited to this configuration.

The readout and control circuitry 615, in some embodiments, may include any or all of a row-level analog front-end (AF) circuitry 606, and a time-to-digital converter (TDC) array circuit 608 operably connected between the AF circuitry 606 and a memory 610. The memory 610 may include a particular section of memory 612 for storing histograms.

A row decoder 616 is operably connected to the pixel array 602 and includes one or more row select circuits that select a particular set of rows of the pixels 604. A column decoder 618 is also operably connected to the pixel array 602 and includes one or more column select circuits that select a particular set of columns of the pixels 604. The row decoder 616 and the column decoder 618 can be used together to select a set of the pixels 604. In some embodiments, the row decoder 616 and the column decoder 618 repeatedly select a section of pixels 604 to be scanned. For example, a representative light beam 620 is shown striking the pixel array 602, and the pixels 622 (with the cross-hatching) represent the pixels that can be selected to be scanned when the light beam 620 is positioned as shown. The pixels 622 constitute a subset of the pixels 604 in the pixel array 602. As the light beam 620 continues to move across the pixel array 602, the pixels 622 are deselected and a subsequent different group of pixels is selected for readout. There may be some pixels in common between the pixels 622 and the subsequent group of pixels. This process continues until the light beam 620 has moved either across the entire pixel array 602 or until a desired portion of the pixel array 602 has been read.

The pixels 622 with enabled SPADs are arranged in a non-linear arrangement in FIG. 6. In particular, the pixels 622 near the two horizontal edges of the pixel array 602 form a curved pattern to account for the shape of the light beam 620 received from a lens. Other non-linear arrangements of pixels with enabled SPADs may comprise piecewise linear sections of such pixels. In other embodiments, the pixels 622 with enabled SPADs may be arranged in a linear arrangement, e.g., they may be the pixels across a set of adjacent rows. In other embodiments, pixels within the specific columns of the adjacent rows may not be enabled. One of skill in the art will recognize that the pattern of pixels 622 with enabled SPADs can be arranged in any given arrangement.

The row decoder 616 and/or the column decoder 618 may be in communication with a processing device (e.g., processing device 108 in FIG. 1). The processing device can provide signals to the row decoder 616 and to the column decoder 618 to read out the signals from one or more pixels 604.

In a line-scan system, such as the system shown in FIG. 2, the pixel array 602 can be read out section-by-section (e.g., subset-by-subset). To reduce power consumption, only the operations of the SPADs in the pixels 604 in a selected section of the pixel array 602 (e.g., two or three columns) may be enabled to detect photons at a time. As explained further below, a SPAD can be enabled by applying a reverse bias sufficient so that an impinging photon creates an avalanche, and/or applying appropriate signaling to transistors linked with the SPAD so that the SPAD output signals are transmitted. The operations of the SPADs in the remaining pixels are disabled. As described earlier, the representative light beam 620 is shown striking the pixel array 602 and the pixels 622 (with the cross-hatching) represent the pixels having SPADs that are enabled to detect the photons in the light beam 620. Thus, in FIG. 6, the SPADs in the pixels 622 are enabled and selected for readout and the SPADs in the remaining pixels 604 are disabled (such as by removing reverse bias, or other control operations) and are not selected for readout. As the light beam 620 continues to move across the pixel array 602, the SPADs in the pixels 622 are deselected and disabled and the SPADs in another section of pixels are enabled and selected for readout. The process of disabling/deselecting SPADs and enabling/selecting SPADs continues until the light beam 620 has moved across the entire pixel array 602.

The TDC array circuit 608 includes N TDC circuits for each row of pixels in the pixel array 602, where N represents the maximum number of SPADs (e.g., pixels 622) that could be enabled at any one time for detecting reflected photons during each scan. In some embodiments, the number N may be less than the total number of pixels in a row of the pixel array; e.g., some pixels may be reserved for generating reference signals. The TDC circuits measure the arrival time of the photons detected by the enabled SPADs. The arrival times are used to construct the histograms for each enabled SPAD.

The memory 610 stores N histograms in respective histogram memories 612 for each row of pixels in the pixel array 602, where N represents the number of enabled SPADs during a readout operation.

The controller 614 generates timing signals for the TDC array circuit 608. Any suitable controller can be used. For example, the controller 614 may include ancillary circuitry to generate reference timing signals such as a phase-locked loop circuit or a delay-locked loop circuit.

An enlarged section depicts a portion of a row in the pixel array 602. Each pixel 604 in a row is connected to a respective one of three output lines 624. This arrangement allows up to three enabled SPADs (e.g., pixels 622) to be read out individually and simultaneously, although two enabled SPADs are illustrated. In embodiments when it is desirable to read out multiple adjacent pixels individually, those pixels can be connected to distinct readout lines connected to the AF (e.g., to individually measure any three adjacent pixels, each pixel would be connected to a distinct readout line). The SPADs in the remaining pixels 626 in the enlarged section are disabled. Thus, the readout of the two pixels 622 shown in the enlarged section is performed independently because the two pixels 622 are connected to different output lines. Although three output lines 624 are shown in FIG. 6, other embodiments are not limited to three output lines. Any number of output lines may be used in other embodiments. Any suitable number of output lines may be used based on the movement of the light beam 620, the width of the light beam 620, and the positional uncertainty of the light beam 620.

One or more gating signals $V_{GATE}$ is input into the pixel array 602 to select and enable (or deselect and disable) the operations of the SPADs in the pixels 604. For example, in one embodiment, one or more corresponding column select circuit(s) in the column decoder 618 can produce the gating signal(s) $V_{GATE}$ to select one or more columns of pixels and to enable the SPADs in the selected pixels.

Figure 7:
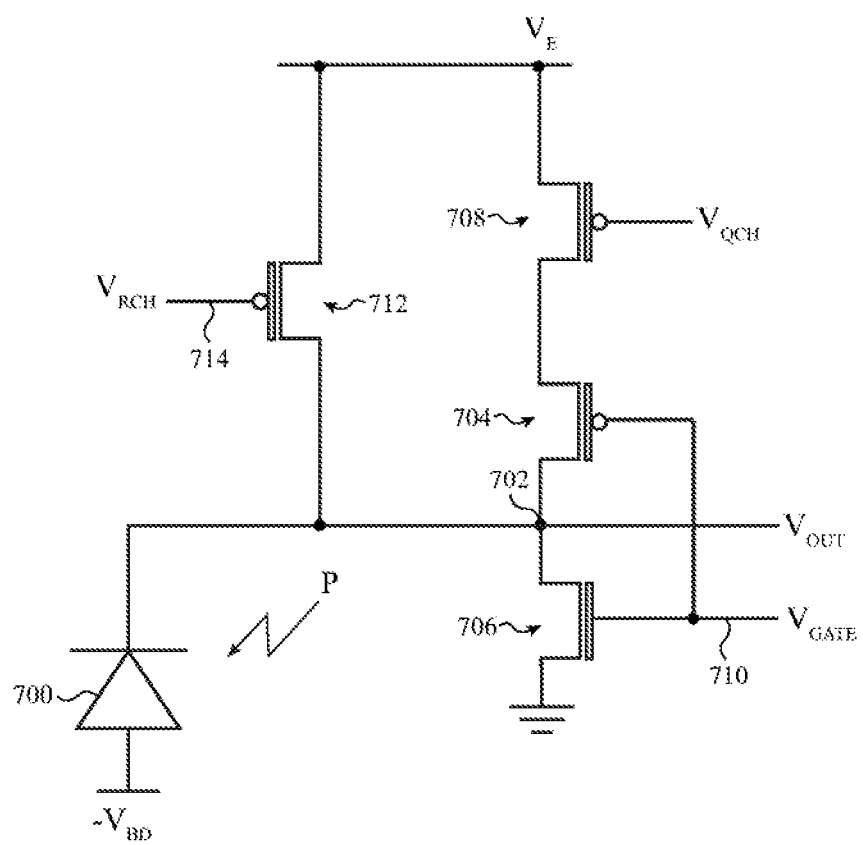
FIG. 7 shows a schematic diagram of an example pixel in a SPAD detector that is configured to be enabled and disabled.

FIG. 7 shows a schematic diagram of an example pixel in a SPAD detector that is configured to be enabled and disabled. A SPAD 700 is connected between a negative voltage supply $-V_{BD}$ and a node 702 on the output line on which voltage $V_{OUT}$ is taken. Although the SPAD 700 is depicted with the anode connected to the negative voltage supply $-V_{BD}$ and the cathode connected to the node 702, other embodiments are not limited to this configuration.

A first terminal of a select transistor 704 and a first terminal of a gating transistor 706 are also connected to the node 702. A second terminal of the gating transistor 706 is connected to a reference voltage (e.g., a ground). A second terminal of the select transistor 704 is connected to a first terminal of a quenching transistor 708. The second terminal of the quenching transistor 708 is connected to a voltage supply $V_E$. The gates of the select transistor 704 and the gating transistor 706 are connected to a common input line 710. The gating signal $V_{GATE}$ is applied to the input line 710 to enable and select the SPAD 700 and to disable and deselect the SPAD 700. Thus, the gating signal $V_{GATE}$ determines the detection period of the SPAD 700. When the SPAD is enabled, avalanche events are detected on output line $V_{OUT}$. The output line $V_{OUT}$ can be connected to, e.g., the analog front end 606 of FIG. 6. A photon impinging on the enabled SPAD 700 causes an avalanche current to flow between the voltage source $V_E$ and $-V_{BD}$. This induces a voltage change in $V_{OUT}$ at the node 702. This voltage change can be detected and amplified by the AF 606.

In FIG. 7, the select transistor 704 and the quenching transistor 708 are depicted as PMOS transistors and the gating transistor 706 is shown as an NMOS transistor. However, other embodiments may use alternate circuitry and circuit configurations. In other embodiments, the select transistor 704 and the quenching transistor 708 may be NMOS transistors and the gating transistor 706 a PMOS transistor. Alternatively, the select transistor 704, the gating transistor 706, and/or the quenching transistor 708 may each be configured as a different type of transistor or circuit.

The pixel shown in FIG. 7 also includes an optional fast recharge transistor 712 connected from the positive supply voltage $V_E$ and the output line of $V_{OUT}$. For the pixel shown, fast recharge transistor 712 is a PMOS transistor. The fast recharge transistor 712 is gated by a recharge signal $V_{RCH}$ 714. The recharge signal $V_{RCH}$ 714 can be synchronized with the gating signal $V_{GATE}$.

Figure 8:
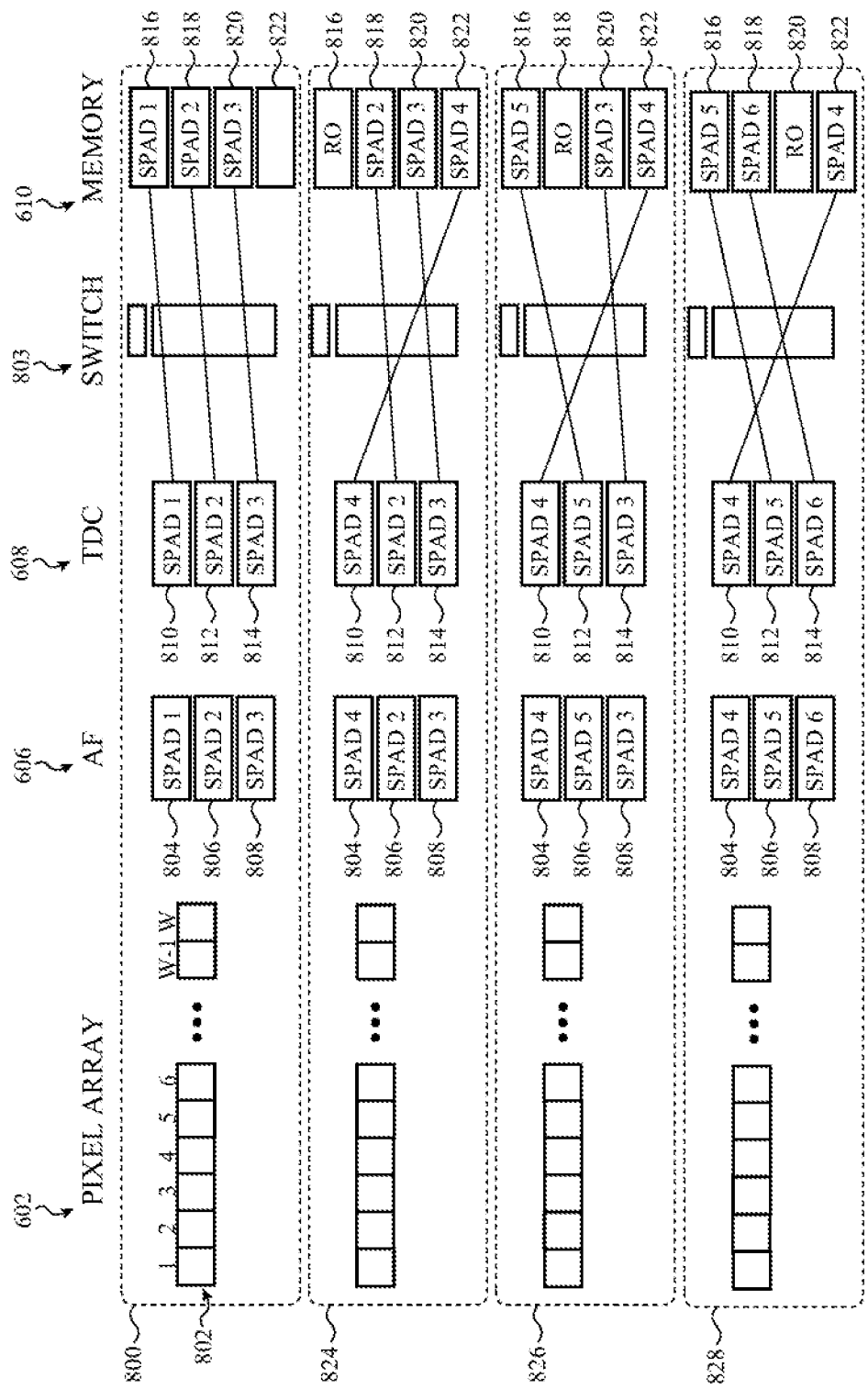
FIG. 8 shows a first method for constructing histograms for the SPADs in multiple pixels in a pixel array.

FIG. 8 shows a first method for constructing histograms for the SPADs in multiple pixels in a pixel array. This method accumulates the signals produced by a SPAD in the same histogram memory during the multiple scans of that SPAD. The histogram memories are allocated arbitrarily. In FIG. 8, the histogram memories are assigned in a round-robin arrangement, although this is not required. The histogram memories can be assigned in any configuration.

The process depicted in FIG. 8 allows the memory 610 to have a smaller size because only a select number of SPADs in a line of pixels are enabled and scanned at one time and the same histogram memories are used to accumulate the signals. Additionally, the bandwidth of the SPAD detector is low because only one histogram memory is read out at a time.

The pixel array 602 is depicted as having one line (e.g., a row) of W pixels, where W represents the number of columns in the pixel array. Although the process shown in FIG. 8 is described in conjunction with the SPADs in six pixels, those skilled in the art will recognize that the process continues for all W pixels in the line. Additionally, the pixel array 602 can include any number of lines of pixels, and each line may include any number of pixels. The method can be used simultaneously with some or all of the lines of pixels.

The line 802 of pixels includes six pixels having SPADs 1, 2, 3, 4, 5, 6. The SPADs 1, 2, 3, 4, 5, 6 are scanned during the described scan operation. During a first time period 800, the SPADs 1, 2, 3 are enabled and produce signals each time a photon is detected. Although three SPADs are enabled at a time (for a given row) in the illustrated embodiment, other embodiments are not limited to three SPADs. Any number of SPADs can be enabled in other embodiments. The number of SPADs that is enabled may be determined by the light beam width, the movement of the light beam during a scan operation, and the positional uncertainty associated with the light beam.

Each signal received from SPAD 1 is stored and processed by AF 606 (represented by block 804) and processed by TDC circuit 810 in the TDC array circuit 608. The TDC circuit 810 outputs TDC output values that each represent the arrival time (e.g., time-of-flight (TOF)) of a photon detected by SPAD 1.

In the illustrated embodiment, a switch 803 is connected between the TDC array circuit 608 and the memory 610. Any suitable switch or switches can be used. In one embodiment, the switch 803 is implemented with several multiplexers. The switch 803 selects a respective histogram memory 816, 818, 820 to send each TDC output value. For SPAD 1, the TDC output values are stored in the histogram memory 816. The TDC output values are used to construct a histogram for SPAD 1 in the histogram memory 816.

Each signal received from SPAD 2 during the first time period 800 is stored and processed by AF 606 (represented by block 806) and processed by TDC circuit 812 in the TDC array circuit 608. The switch 803 selects the histogram memory 818 to send each TDC output value produced for SPAD 2. A histogram is constructed for SPAD 2 in the histogram memory 818 using the TDC output values.

Each signal received from SPAD 3 during the first time period 800 is stored and processed by AF 606 (represented by block 808) and processed by TDC circuit 814 in the TDC array circuit 608. The switch 803 selects the histogram memory 820 to send each TDC output value produced for SPAD 3. A histogram is constructed for SPAD 3 in the histogram memory 820 using the TDC output values.

During a second time period 824, SPADs 2, 3, 4 are selected and enabled, and the histogram constructed for SPAD 1 is read out of the histogram memory 816 (readout indicated by RO). Each signal received from SPAD 2 is stored and processed by AF 606 (represented by block 806) and processed by TDC circuit 812 in the TDC array circuit 608. The switch 803 selects the histogram memory 818 to send each TDC output value produced for SPAD 2 during the second time period 824. The histogram in the histogram memory 818 is updated using the TDC output values.

Each signal received from SPAD 3 during the second time period 824 is stored and processed by AF 606 (represented by block 808) and processed by TDC circuit 814 in the TDC array circuit 608. The switch 803 selects the histogram memory 820 to send each TDC output value produced for SPAD 3 during the second time period 824. The histogram in the histogram memory 820 is updated using the TDC output values.

Each signal received from SPAD 4 during the second time period 824 is stored and processed by AF 606 (represented by block 804) and processed by TDC circuit 810 in the TDC array circuit 608. The switch 803 selects the histogram memory 822 to send each TDC output value produced for SPAD 4 during the second time period 824. A histogram is constructed for SPAD 4 in the histogram memory 822 using the TDC output values.

During a third time period 826, SPADs 3, 4, 5 are enabled and the histogram constructed for SPAD 2 is read out of the histogram memory 818. Each signal received from the SPAD 3 is stored and processed by AF 606 (represented by block 808) and processed by TDC circuit 814 in the TDC array circuit 608. The switch 803 selects the histogram memory 820 to send each TDC output value produced for SPAD 3 during the third time period 826. The histogram in the histogram memory 820 is updated using the TDC output values.

Each signal received from SPAD 4 during the third time period 826 is stored and processed by AF 606 (represented by block 804) and processed by TDC circuit 810 in the TDC array circuit 608. The switch 803 selects the histogram memory 822 to send each TDC output value produced for SPAD 4 during the third time period 826. The histogram in the histogram memory 822 is updated using the TDC output values.

Each signal received from SPAD 5 during the third time period 826 is stored and processed by AF 606 (represented by block 806) and processed by TDC circuit 812 in the TDC array circuit 608. The switch 803 selects the now empty histogram memory 816 to send each TDC output value produced for SPAD 5. A histogram is constructed for SPAD 5 in the histogram memory 816 using the TDC output values.

During a fourth time period 828, SPADs 4, 5, 6 are enabled and the histogram constructed for SPAD 3 is read out of the histogram memory 820. Each signal received from SPAD 4 is stored and processed by AF 606 (represented by block 804) and processed by TDC circuit 810 in the TDC array circuit 608. The switch 803 selects the histogram memory 822 to send each TDC output value produced for SPAD 4 during the fourth time period 828. The histogram in the histogram memory 822 is updated using the TDC output values.

Each signal received from SPAD 5 during the fourth time period 828 is stored and processed by AF 606 (represented by block 806) and processed by TDC circuit 812 in the TDC array circuit 608. The switch 803 selects the histogram memory 816 to send each TDC output value produced for SPAD 5 during the fourth time period 828. The histogram in the histogram memory 816 is updated using the TDC output values.

Each signal received from SPAD 6 during the fourth time period 828 is stored and processed by AF 606 (represented by block 808) and processed by TDC circuit 814 in the TDC array circuit 608. The switch 803 selects the now empty histogram memory 818 to send each TDC output value produced for SPAD 6. A histogram is constructed for SPAD 6 in the histogram memory 820 using the TDC output values.

In the embodiment shown in FIG. 8, the number of AF circuits (e.g., blocks 804, 806, 808) in the AF circuitry 606 and the number of TDC circuits (e.g., blocks 810, 812, 814) in the TDC array circuit 608 correspond to the maximum number of enabled SPADs in the line 802 of pixels. Similarly, the number of histogram memories (e.g., blocks 816, 818, 820, 822) is determined by adding one to the maximum number of enabled SPADs in the line 802 of pixels (e.g., max number of enabled SPADs+1). However, other embodiments are not limited to this configuration. Any number of AF circuits, of TDC circuits, and of histogram memories can be used in other embodiments.

Figure 9A:
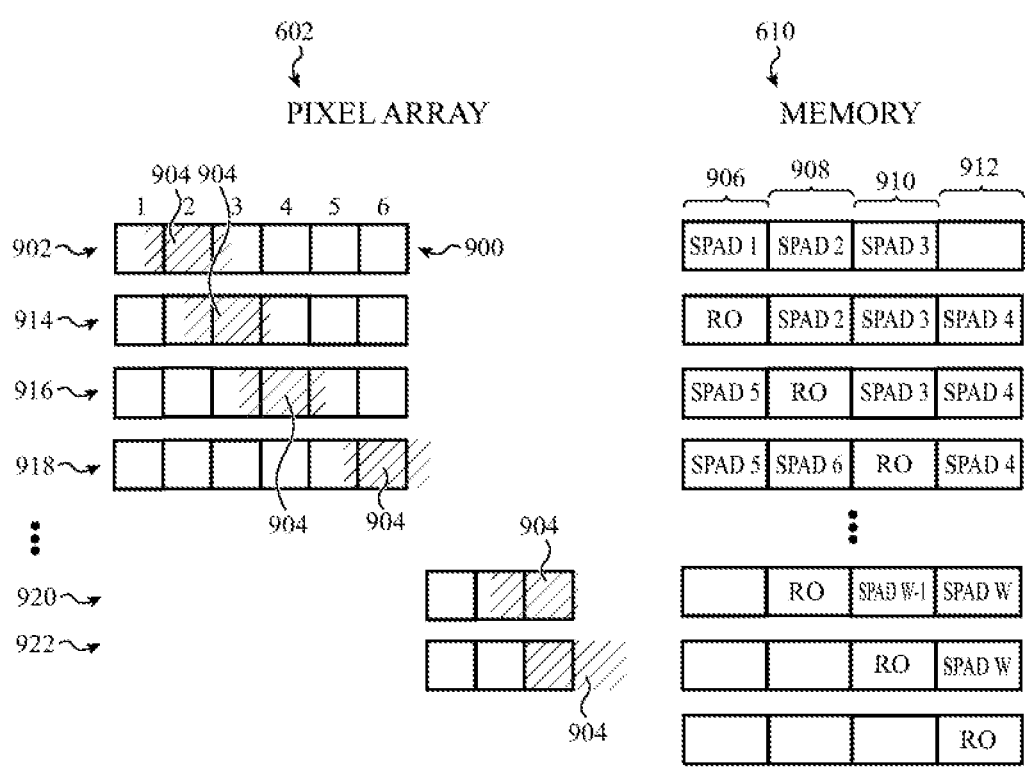
FIG. 9A shows a second method for constructing histograms for the SPADs in multiple pixels in a pixel array.

FIG. 9A shows a second method for constructing histograms for the SPADs in multiple pixels in a pixel array. This method accumulates signals in the same histogram memory during multiple scans of the same SPAD. The histogram memories are allocated on a rolling basis. For example, the method shown in FIG. 9A uses the round robin process described with respect to FIG. 8. This allows the memory 610 to have a smaller size because only the SPADs in a select number of pixels are enabled in a line at a time and the same histogram memories are used to accumulate the signals. Additionally, the bandwidth of the SPAD detector is low because only one histogram memory is read out at a time.

Like the embodiment shown in FIG. 8, the pixel array 602 in FIG. 9A is depicted as having one line 900 (e.g., a row) of W pixels and the process is described in conjunction with the SPADs in select pixels. Those skilled in the art will recognize that the process is used for all W pixels in the line. Additionally, the pixel array 602 can include any number of lines of pixels, and each line may include any number of pixels. The method can be used simultaneously with some or all of the lines of pixels.

During a first time period 902, SPADs 1, 2, 3 are enabled. Although the SPADs in three pixels are enabled at a time in the illustrated embodiment, other embodiments are not limited to three SPADs. In other embodiments, any number of SPADs can be enabled. The number of SPADs that are enabled may be determined by the light beam width, the movement of the light beam during a scan operation, and the positional uncertainty associated with the light beam. The number of SPADs that can be enabled may also be chosen dynamically during operation of the SPAD detector. For example, the emitted pulses from emitter 204 may be broadened or narrowed, and/or the lens 216 may be able to alter how narrowly it focuses the reflected pulses.

During the time period 902, the histogram constructed for SPAD 1 is stored in the histogram memory 906, the histogram constructed for SPAD 2 is stored in the histogram memory 908, and the histogram constructed for SPAD 3 is stored in the histogram memory 910.

As the light beam 904 moves along the line 900 of pixels, SPADs 2, 3, 4 are enabled during a second time period 914. The histogram for SPAD 2 stored in the histogram memory 908 is updated and the histogram for SPAD 3 stored in the histogram memory 910 is updated. Additionally, a histogram is constructed in the histogram memory 912 for SPAD 4. The histogram for SPAD 1 is read out of the histogram memory 906.

As the light beam 904 continues to move along the line 900 of pixels, SPADs 3, 4, 5 are enabled during a third time period 916. The histogram for SPAD 3 stored in the histogram memory 910 is updated and the histogram for SPAD 4 stored in the histogram memory 912 is updated. Additionally, a histogram for SPAD 5 is constructed in the now empty histogram memory 906. The histogram for SPAD 2 is read out of the histogram memory 908.

As the light beam 904 moves along the line 900 of pixels, SPADs 4, 5, 6 are enabled during a fourth time period 918. The histogram for SPAD 4 stored in the histogram memory 912 is updated and the histogram for SPAD 5 stored in the histogram memory 906 is updated. Additionally, a histogram for SPAD 6 is constructed in the now empty histogram memory 908. The histogram for SPAD 3 is read out of the histogram memory 910.

During a subsequent time period 920 (e.g., near the end of the line scan operation), the SPADs (W–1) and W are enabled and the histogram for SPAD (W–2) is read out of the histogram memory 908. The histogram for SPAD (W–1) stored in the histogram memory 910 is updated and the histogram for SPAD W stored in the histogram memory 912 is updated.

During the time period 922 (e.g., at the end of the line scan operation), SPAD W is enabled and the histogram for SPAD (W–1) is read out of the histogram memory 910. The histogram for SPAD W stored in the histogram memory 912 is updated during the time period 922. The histogram for SPAD W is read out of the histogram memory 912 after the time period 922 ends.

Like the embodiment shown in FIG. 8, the number of AF circuits in the AF circuitry and the number of TDC circuits in the TDC array circuit used with the embodiment in FIG. 9A may correspond to the maximum number of enabled SPADs in the line 900 of pixels (although this is not required). Similarly, the number of histogram memories 906, 908, 910, 912 can be determined by adding one to the maximum number of enabled SPADs in the line 900 of pixels, although this is not required.

Figure 9B:
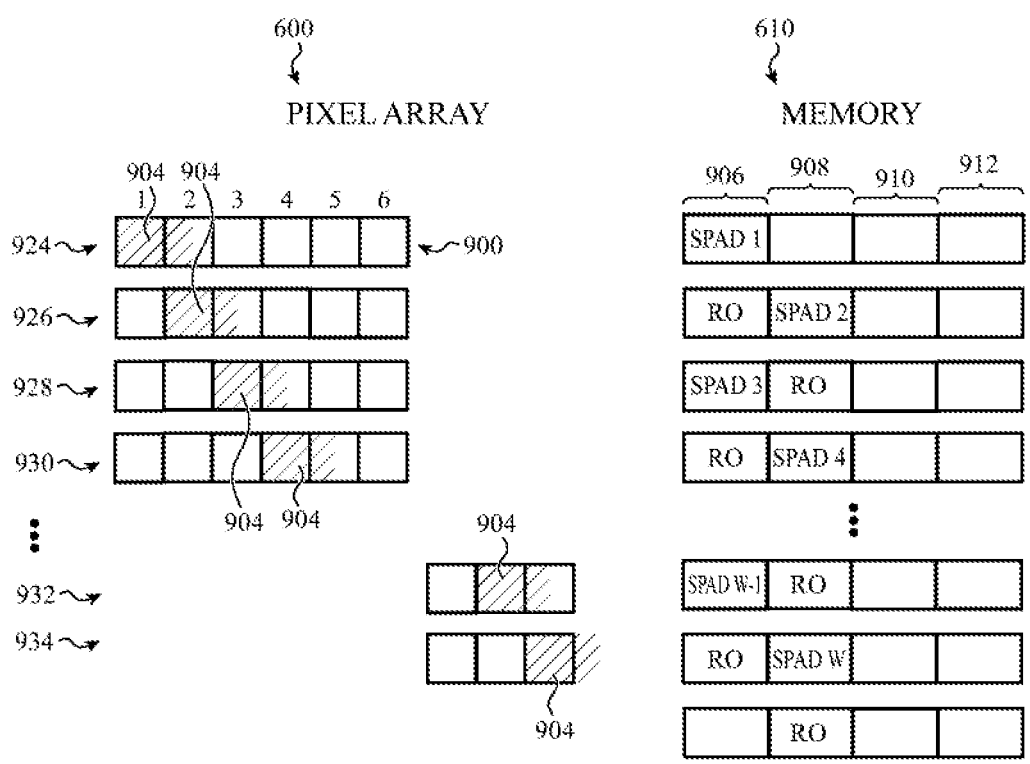
FIG. 9B shows a third method for constructing histograms for the SPADs in multiple pixels in a pixel array.

FIG. 9B shows a third method for constructing histograms for the SPADs in multiple pixels in a pixel array. The illustrated process is a modification of the method shown in FIG. 9A. In FIG. 9B, a double buffering technique is employed where during one scan, one histogram memory is receiving data while the other histogram memory is read out. The process in FIG. 9B may be used when the pixels scanned once because the SPADs in the pixels accumulate a sufficient number of signals to produce an acceptable TOF determination. In FIG. 9B, the histogram memories 906, 908 are used in the double buffering process and the histogram memories 910, 912 are power gated to minimize static power.

During a first time period 924, SPAD 1 is enabled. A histogram constructed for SPAD 1 is stored in the histogram memory 906.

As the light beam 904 moves along the line 900 of pixels, SPAD 2 is enabled during a second time period 926 and the histogram for SPAD 1 is read out of the histogram memory 906. A histogram for SPAD 2 is constructed in the histogram memory 908.

As the light beam 904 continues to move along the line 900 of pixels, SPAD 3 is enabled during a third time period 928 and the histogram for SPAD 2 is read out of the histogram memory 908. A histogram for SPAD 3 is constructed in the histogram memory 906.

As the light beam 904 moves along the line 900 of pixels, SPAD 4 is enabled during a fourth time period 930 and the histogram for SPAD 3 is read out of the histogram memory 906. A histogram for SPAD 4 is constructed in the histogram memory 908.

During a subsequent time period 932 (e.g., near the end of the line scan operation), SPAD (W–1) is enabled and the histogram for SPAD (W–2) is read out of the histogram memory 908. A histogram for SPAD (W–1) is stored in the histogram memory 906.

During the time period 934 (e.g., at the end of the line scan operation), SPAD W is enabled and the histogram for SPAD (W–1) is read out of the histogram memory 906. A histogram for SPAD W is constructed in the histogram memory 908. The histogram for SPAD W is read out of the histogram memory 908 after the time period 934 ends.

In other embodiments, such as when the SPAD(s) in one or more pixels do not accumulate a sufficient number of signals, the histograms for the SPADs in two or more pixels can be combined after the histograms are read out of the histogram memories to improve the SNR.

Figure 10:
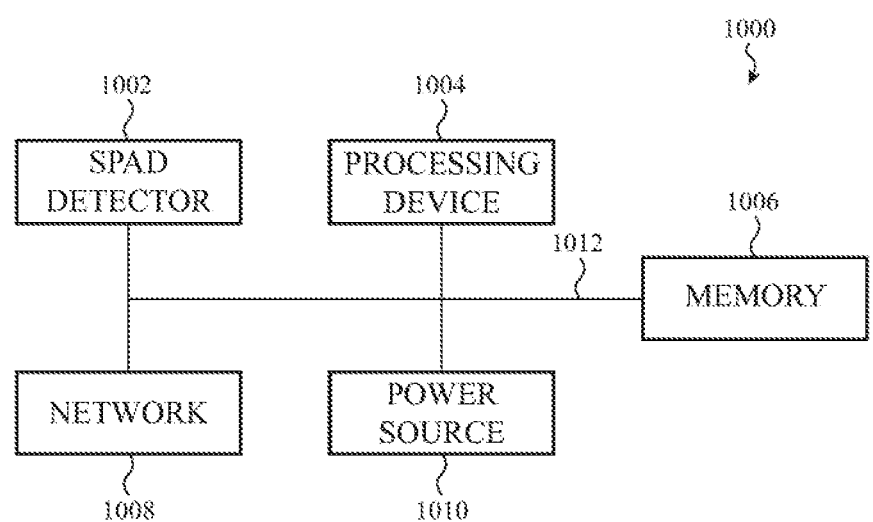
FIG. 10 shows a block diagram of an electronic device that can include one or more SPAD detectors.

FIG. 10 shows a block diagram of an electronic device that can include one or more SPAD detectors. The electronic device 1000 includes one or more SPAD detectors 1002, one or more processing devices 1004, memory 1006, one or more network interfaces 1008, and a power source 1010, each of which will be discussed in turn below.

The one or more processing devices 1004 can control some or all of the operations of the electronic device 1000. The processing device(s) 1004 can communicate, either directly or indirectly, with substantially all of the components of the electronic device 1000. For example, one or more system buses 1012 or other communication mechanisms can provide communication between the SPAD detector(s) 1002, the processing device(s) 1004, the memory 1006, the network interface 1008, and/or the power source 1010. In some embodiments, the processing device(s) 1004 can be configured to receive output signals from the SPAD detectors 1002 and process the output signals to determine one or more characteristics associated with the reflected light, the target (e.g., target 106 in FIG. 1), and/or the scene.

The processing device(s) 1004 can be implemented as any electronic device capable of processing, receiving, or transmitting data or instructions. For example, the one or more processing devices 1004 can be a microprocessor, a central processing unit (CPU), an application-specific integrated circuit (ASIC), a digital signal processor (DSP), or combinations of multiple such devices. As described herein, the term "processor" is meant to encompass a single processor or processing unit, multiple processors, multiple processing units, or other suitably configured computing element or elements.

The memory 1006 can store electronic data that can be used by the electronic device 1000. For example, the memory 1006 can store electrical data or content such as, for example, audio files, document files, timing and control signals, and so on. The memory 1006 can be configured as any type of memory. By way of example only, memory 1006 can be implemented as random access memory, read-only memory, Flash memory, removable memory, or other types of storage elements, in any combination.

The network interface 1008 can receive data from a user or one or more other electronic devices. Additionally, the network interface 1008 can facilitate transmission of data to a user or to other electronic devices. The network interface 1008 can receive data from a network or send and transmit electronic signals via a wireless or wired connection. For example, the photon counts that are determined by the processing device(s) 1004 can be transmitted to another electronic device using the network interface 1008.

Examples of wireless and wired connections include, but are not limited to, cellular, Wi-Fi, Bluetooth, and Ethernet. In one or more embodiments, the network interface 1008 supports multiple network or communication mechanisms. For example, the network interface 1008 can pair with another device over a Bluetooth network to transfer signals to the other device while simultaneously receiving signals from a Wi-Fi or other wired or wireless connection.

The one or more power sources 1010 can be implemented with any device capable of providing energy to the electronic device 1000. For example, the power source 1010 can be a battery. Additionally or alternatively, the power source 1010 can be a wall outlet that the electronic device 1000 connects to with a power cord. Additionally or alternatively, the power source 1010 can be another electronic device that the electronic device 1000 connects to via a wireless or wired connection (e.g., a connection cable), such as a Universal Serial Bus (USB) cable.

In some embodiments, the SPAD detector 1002 is configured as a back-illuminated SPAD detector. In such embodiments, the pixel array is positioned adjacent to a light-receiving surface of the SPAD detector and the circuitry (e.g., gating transistor, quenching transistor, etc.) connected to the SPADs in the pixel array are positioned below the pixel array. Other embodiments can configure the SPAD detector 1002 differently.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A single-photon avalanche diode (SPAD) detector, comprising:
    an array of pixels comprising respective SPADs;
    a column decoder and a row decoder operable to enable a first set of SPADs then a second set of SPADs, wherein enabled SPADs detect photons, wherein the first set of SPADs is different from the second set of SPADs, and wherein at least a first SPAD is included in each of the first set of SPADs and the second set of SPADs, and;
    a time-to-digital converter (TDC) array circuit connected to the array of pixels;
    a memory connected to the TDC array circuit; wherein, the TDC array circuit is configured to,
        receive a first set of output signals from the first SPAD when the first set of SPADs is enabled;
        cause a histogram for the first SPAD to be constructed in the memory, at least partly in response to the first set of output signals;
        receive a second set of output signals from the first SPAD when the second set of SPADs is enabled; and
        update the histogram in response to the second set of output signals.

2. The SPAD detector of claim 1, wherein:
    the histogram is a first histogram;
    a second SPAD is included in the second set of SPADs and not the first set of SPADs; and
    the TDC array circuit is configured to,
        cause a second histogram for the second SPAD to be constructed in the memory while the histogram is being updated in response to the second set of output signals.

3. The SPAD detector of claim 2, wherein:
    the TDC array circuit is configured to,
        receive a third set of output signals from the second SPAD when the second set of SPADs is enabled;
        cause the second histogram for the second SPAD to be constructed in the memory, at least partly in response to the third set of output signals;
        receive a fourth set of output signals from the first SPAD when the second set of SPADs is enabled; and
        update the second histogram in response to the fourth set of output signals.

4. The SPAD detector of claim 3, further comprising:
readout circuitry; and
a controller configured to operate the readout circuitry, to read out the first histogram while the second histogram is being updated in response to the fourth set of output signals.

5. The SPAD detector of claim 4, wherein the controller is configured to, after read out of the first histogram, reallocate a portion of the memory allocated to the first histogram to a third histogram constructed for a third SPAD.

6. The SPAD detector of claim 1, further comprising:
a light source configured to emit a sequence of light pulses in accord with a pulse repetition interval (PRI); wherein,
each output signal in the first set of output signals and each output signal in the second set of output signals corresponds to a respective light pulse in the sequence of light pulses.

7. The SPAD detector of claim 6, wherein the light source is configured to emit the sequence of light pulses in accord with a line scan.

8. The SPAD detector of claim 1, wherein:
the first SPAD is operably connected between a first voltage supply node and an output line on which the first and second sets of output signals are provided;
a gating transistor is operably connected between the output line and a reference voltage node; and
a quenching transistor and a select transistor are operably connected, in series, between the output line and a second voltage supply node; wherein,
the gating transistor is configured to alternatively enable an operation of the first SPAD or disable the operation of the first SPAD.

9. The SPAD detector of claim 8, further comprising a fast recharge transistor operably connected between the output line and the second voltage supply node.

10. The SPAD detector of claim 1, wherein the memory includes a set of histograms for a set of SPAD.

11. A single-photon avalanche diode (SPAD) detector, comprising:
an array of pixels, each pixel including a SPAD;
a set of histogram memories; and
a time-to-digital converter (TDC) array circuit configured to
simultaneously receive output signals from a SPAD in each of N pixels, the N pixels comprising a subset of the pixels in the array of pixels;
constructing a histogram for each SPAD in a respective one of M histogram memories, where M is greater than N; and
accumulating output values based on output signals received from each SPAD over multiple scans of the N pixels in the respective M histogram memories.

12. The SPAD detector of claim 11, wherein the N pixels are included in a same line of pixels in the array of pixels.

13. The SPAD detector of claim 12, wherein the same line of pixels comprises one of a column of pixels or a row of pixels in the array of pixels.

14. The SPAD detector of claim 11, wherein the N pixels are arranged in a non-linear arrangement.

15. The SPAD detector of claim 11, wherein each histogram memory stores counts of time-of-flight values of photons detected by a SPAD.

16. The SPAD detector of claim 11, wherein N=M−1.

17. The SPAD detector of claim 11, further comprising:
a readout circuit; and
a controller configured to read out one of the M histogram memories, then allocate the one of the M histogram memories to a SPAD not included in the N pixels, while continuing to update histograms in the other M−1 histogram memories.

18. A single-photon avalanche diode (SPAD) detector, comprising:
a pixel array comprising multiple SPAD pixels, each SPAD pixel having a respective SPAD;
a light source configured to generate a light beam;
a controller configured to sequentially enable SPAD pixels in different overlapping sections of the pixel array after adjusting a direction of the light beam, each section including a different subset of SPAD pixels;
a time-to-digital converter (TDC) array circuit operably connected to the pixel array and configured to generate output values based on output signals of a SPAD pixel; and
a memory configured to accumulate the output values generated by the TDC array circuit in a set of photon time-of-flight counts; wherein,
a first subset of the output values of the TDC array circuit is generated when the light beam is emitted in a first direction; and
a second subset of the output values of the TDC array circuit is generated when the light beam is emitted in a second direction.

19. The SPAD detector of claim 18, wherein:
the light beam comprises a line of illumination;
the controller is configured to,
move the line of illumination across the pixel array; and
enable a different section of the pixel array after each move of the line of illumination; and
the SPAD pixel is included in at least two different overlapping sections of the pixel array.

20. The SPAD detector of claim 18, wherein a third subset of the output values of the TDC array circuit is generated when the light beam is emitted in a third direction.

* * * * *